(12) United States Patent
Kudoh et al.

(10) Patent No.: US 8,992,687 B2
(45) Date of Patent: Mar. 31, 2015

(54) SUBSTRATE PROCESSING APPARATUS, METHOD FOR PROCESSING SUBSTRATE, AND STORAGE MEDIUM

(75) Inventors: Hiroyuki Kudoh, Koshi (JP); Hideto Mori, Koshi (JP); Shinji Okada, Koshi (JP); Toyohisa Tsuruda, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 361 days.

(21) Appl. No.: 13/218,983

(22) Filed: Aug. 26, 2011

(65) Prior Publication Data
US 2011/0308464 A1 Dec. 22, 2011

Related U.S. Application Data

(62) Division of application No. 12/163,163, filed on Jun. 27, 2008, now abandoned.

(30) Foreign Application Priority Data

Jul. 26, 2007 (JP) .................................. 2007-194833

(51) Int. Cl.
| C23C 16/455 | (2006.01) |
| C23C 16/52 | (2006.01) |
| C23C 16/458 | (2006.01) |
| H01L 21/67 | (2006.01) |

(52) U.S. Cl.
CPC ............... *H01L 21/67017* (2013.01)
USPC .......................................... 118/728; 118/719

(58) Field of Classification Search
USPC ................ 118/728, 719; 3/728; 156/345
See application file for complete search history.

(56) References Cited

U.S. PATENT DOCUMENTS

| 6,024,502 A | 2/2000 | Akimoto et al. |
| 6,156,125 A | 12/2000 | Harada |
| 6,261,744 B1 | 7/2001 | Yoshioka |
| 6,544,338 B1 | 4/2003 | Batchelder et al. |
| 2004/0003896 A1* | 1/2004 | Sugahara ................. 156/345.28 |

FOREIGN PATENT DOCUMENTS

| JP | 10-135125 | 5/1998 |
| JP | 11-214292 | 8/1999 |

* cited by examiner

*Primary Examiner* — Parviz Hassanzadeh
*Assistant Examiner* — Nathan K Ford
(74) *Attorney, Agent, or Firm* — Oblon, Spivak, McClelland, Maier & Neustadt, L.L.P.

(57) ABSTRACT

Processing gas is supplied from the central upper part of a processing chamber to a wafer on a mounting board, while the processing chamber is exhausted from processing gas exhaust passages at areas outside of the wafer. In addition, purge gas is supplied from purge gas supply passages to a buffer chamber formed between the peripheral part of a container main body and that of a cover body. The supplied flow-rate of the processing gas is made less than the exhaust flow-rate in the processing gas exhaust passages. Accordingly, the purge gas in the buffer chamber is drawn into the processing chamber via a purge gas supply hole formed of a gap between the container main body and the cover body due to a negative pressure inside the processing chamber caused by a difference between the flow rates.

9 Claims, 15 Drawing Sheets

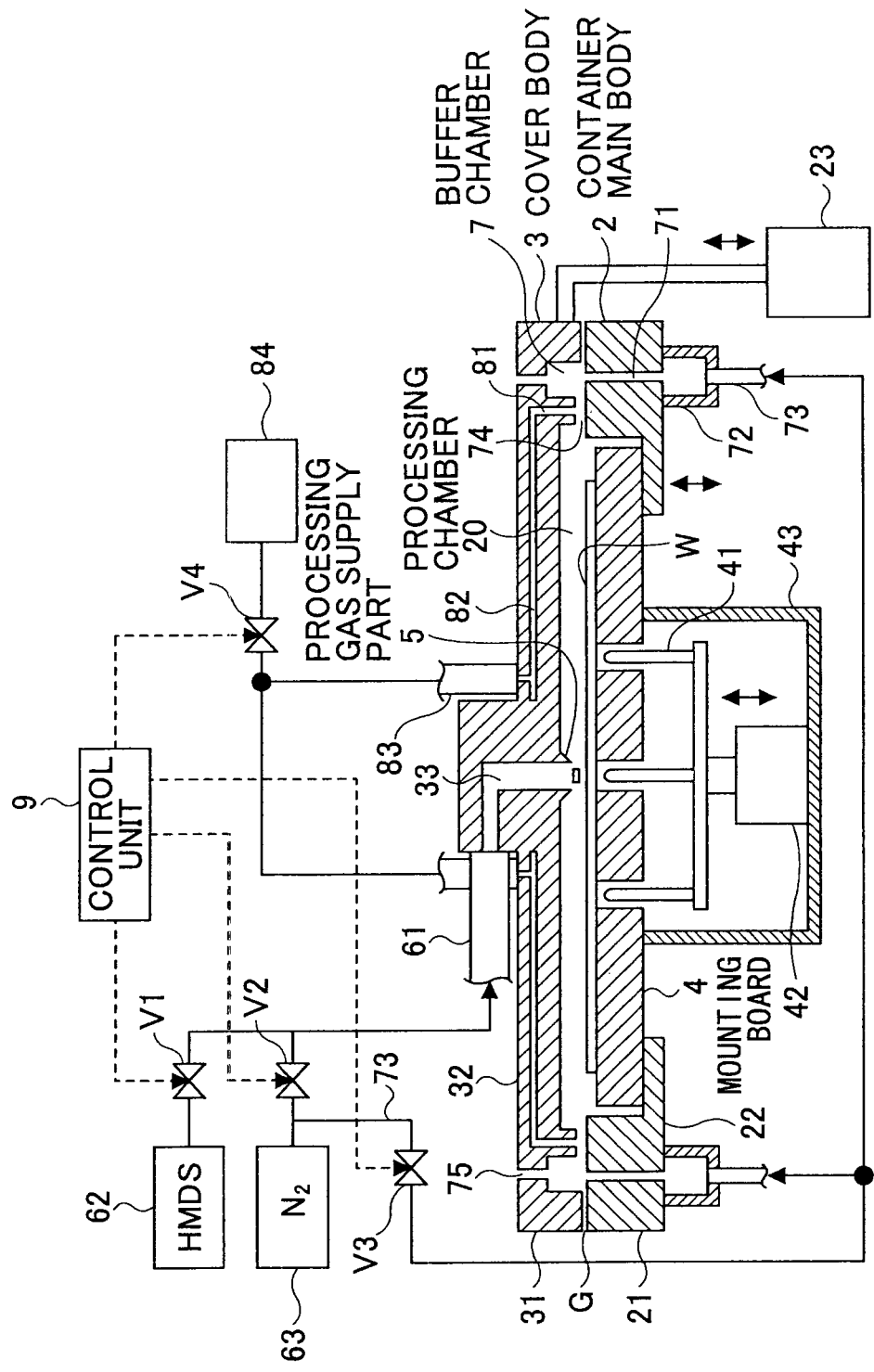

SUBSTRATE PROCESSING APPARATUS, METHOD FOR PROCESSING SUBSTRATE, AND STORAGE MEDIUM

CROSS REFERENCE

This application is a division of and is based upon and claims the benefit of priority under 35 U.S.C. §120 for U.S. Ser. No. 12/163,163, filed Jun. 27, 2008, now abandoned, and claims the benefit of priority under 35 U.S.C. §119 from Japanese Patent Application No. 2007-194833, filed Jul. 26, 2007, the entire contents of each of which are incorporated herein by reference.

BACKGROUND OF THE INVENTION

1. Field of the Invention

The present invention relates to a technique for performing predetermined substrate processing such as hydrophobic processing on a semiconductor device, a LCD (liquid crystal display) substrate, etc.

2. Description of the Related Art

As one of a series of steps for forming a resist pattern in a manufacturing process for a semiconductor device, a LCD substrate, etc., hydrophobic processing is performed on a substrate such as a semiconductor wafer (hereinafter referred to as a "wafer") W. This processing is performed to enhance the adhesion between a substrate film and a resist film before a resist liquid is applied thin film thereon so that the front surface property of the wafer W is changed from hydrophilicity to hydrophobicity. In this case, the hydrophobic processing is preferably performed on the front surface of the wafer W and a beveled part (the end surface of an outer peripheral part). The advantage of the hydrophobic processing is that the resist film is not easily peeled even when liquid immersion exposure processing is performed at a later process to expose light with water interposed between the wafer W and an exposure device.

Referring here to FIGS. 1 and 2, a description is made of the hydrophobic processing together with the configuration of an apparatus that performs this processing. First, the wafer W is conveyed into a processing chamber 10 composed of a container main body 11 and a cover body 12 and then mounted on a mounting board 13 (step S11). In other words, the wafer W is conveyed into an opening part formed when the cover body 12 is lifted up relative to the container main body 11, and then the cover body 12 is lowered to make the container main body 11 and the cover body 12 come into contact with each other so as to close the opening part. In this case, if the wafer W is transferred from an outer conveying unit to the mounting board 13, lifting pins 14 incorporated in the mounting board 13 are used.

Next, the processing chamber 10 is hermetically sealed (step S12). Because the emission of HMDS gas into a clean room causes particles or the HMDS reacts with the moisture in the air to cause ammonia that adversely affects the shape of a resist pattern, the processing chamber 10 is hermetically sealed to prevent the leakage of the HMDS gas. Specifically, in order to hermetically seal the processing chamber 10, an exhaust passage 15 formed at a contact part between the container main body 11 and the cover body 12 is exhausted by an exhaust unit 16 for hermetic sealing so that the container main body 11 and the cover body 12 are closely attached to each other by suction. In FIG. 1, reference numeral 15a denotes a seal member provided around the exhaust passage 15.

Subsequently, HMDS gas is supplied into the processing chamber 10 to perform the hydrophobic processing (step S13). At nearly the central part of the cover body 12, a gas nozzle 17 is formed. The FINDS gas is supplied into the processing chamber 10 in spray form from the gas nozzle 17 via a gas supply pipe 17b and a gas supply passage 17a formed in the cover body 12. The FINDS gas fills the processing chamber 10 in this manner so as to perform the hydrophobic processing. In this case, however, the HMDS gas is dispersed into a gap formed between the container main body 11 and the side wall part of the mounting board 13, movement areas of the lifting pins 14 formed in the mounting board 13, and an enclosure 14a covering the lifting areas of the lifting pins 14 formed below the mounting board 13. Then, the HMDS gas is extruded from exhaust passages 18 connected to the gap and the enclosure 14a and exhausted to outside of the processing chamber 10. Note that the exhaust unit 19 connected to the exhaust passages 18 is not actuated in this process.

After the completion of the hydrophobic processing, the HMDS gas is substituted for before the cover body 12 is opened (step S14). The purpose of the substitution processing is to prevent the emission of the HMDS gas from the processing chamber 10. In this process, $N_2$ (nitrogen) gas as substitution gas is supplied to the gas supply pipe 17b, while the exhaust unit 19 is actuated. In this case, because the amount exhausted by the exhaust unit 19 is made slightly greater than the supplied amount of the $N_2$ so as to prevent the emission of the HMDS gas from the processing chamber 10 in addition to the fact that the processing chamber 10 is hermetically sealed, the pressure inside the processing chamber 10 becomes negative. Following the substitution processing, the exhaust unit 19 is stopped to restore the pressure inside the processing chamber 10 to atmospheric pressure, while the exhaust unit 16 for hermetic sealing is stopped to open the processing chamber 10 (step S15). Then, the cover body 12 is lifted up to open the processing chamber 10, and the wafer W is taken out from the processing chamber 10 (step S16).

In such a hydrophobic processing apparatus, because the processing chamber 10 is hermetically sealed as described above, the pressures inside the movement areas of the lifting pins 14 and the enclosure 14a as well as the pressure inside the processing chamber 10 become negative during the substitution processing. As a result, the HMDS gas spreads to the rear surface of the wafer W, which causes the hydrophobic processing to be performed even on an unnecessary part of the rear surface of the wafer W. The allowable range of the hydrophobic processing on the rear surface of the wafer W is about 1 cm away from its outer peripheral part. However, if the FINDS gas largely spreads to the rear surface of the wafer W and the hydrophobic processing is performed thereon, the following problem arises. In other words, when paint thinner is supplied to cleanse the rear surface of the wafer W so as to remove a stain therefrom after the application of a resist liquid, the paint thinner is likely to be repelled to allow the stain to remain on the rear surface of the wafer W.

Furthermore, in order to hermetically seal the processing chamber 10, it is necessary to provide a hermetically-sealing mechanism including the exhaust passage 15, the seal member 15a, the exhaust unit 16 for hermetic sealing, etc., between the container main body 11 and the cover body 12. This results in an increase in the number of components of the hydrophobic processing apparatus and makes its structure complicated. Therefore, the assembling operation of the apparatus is a lot of trouble. In addition, the complicated structure easily causes an error in assembling the apparatus, which requires an operation for adjusting the error and an inspection process and a management process to determine the presence or absence of error in assembling the apparatus. As a result, this increases the burden on an operator.

Moreover, the gas nozzle 17 is formed tapered to supply the HMDS gas or the $N_2$ gas in the processing chamber 10, and the HMDS gas or the like is sprayed downward toward the wafer W in spray form from the gas nozzle 17. Under this configuration, however, the degree of intensity in blowing the gas is different depending on an area, which easily causes air turbulence and generates a turbulent flow between the wafer W and the cover body 12. This results in hindering the quick dispersion of the gas. Therefore, the substitution of the HMDS gas for the $N_2$ gas hardly advances, and thus the substitution processing takes much time.

Accordingly, the present inventors have studied a configuration for preventing the leakage of gas from the processing chamber without hermetically sealing the processing chamber. Meanwhile, Patent Document 1 proposes a configuration in which an upper constituent member and a lower constituent member are joined together without a clamp to maintain the air tightness of the processing chamber. Besides, Patent Document 2 proposes a technique for supplying processing gas and substitution gas into the processing chamber via different passages. However, these techniques are not intended to perform the hydrophobic processing without hermetically sealing the processing chamber and thus do not solve the above problems.

Patent Document 1: JP-A-11-214292
Patent Document 2: JP-A-10-135125

SUMMARY OF THE INVENTION

The present invention has been made in light of the above circumstances and may prevent the leakage of gas from a processing chamber without hermetically sealing the processing chamber to reduce the spreading of the gas to the rear surface of a substrate.

According to one aspect of the present invention, there is provided a substrate processing apparatus. The apparatus comprises a container main body that has a mounting board for a substrate and the upper part of which container main body is open; a cover body that covers the container main body with the peripheral part of the cover body coming close to the peripheral part of the container main body via a gap or with the peripheral part of the cover body coming into contact with the peripheral part of the container main body, thereby forming a processing chamber for the substrate; a processing gas supply part that supplies processing gas from the central upper part of the processing chamber to the substrate on the mounting board; a processing gas exhaust passage that exhausts the processing chamber from the area outside of the substrate on the mounting board when the processing gas is supplied from the processing gas supply part into the processing chamber; a purge gas supply passage that is open between the peripheral part of the container main body and the peripheral part of the cover body along the circumferential direction of the container main body; an outflow passage that is formed along the circumferential direction of the processing chamber so that purge gas between the peripheral parts supplied from the purge gas supply passage flows to the outside of the processing chamber; and a gas flowing gap formed from the opening part of the purge gas supply passage to the processing chamber along the circumferential direction of the processing chamber between the peripheral part of the container main body and the peripheral part of the cover body. In this substrate processing apparatus, a supplied flow-rate of the processing gas from the processing gas supply part is less than an exhaust flow-rate in the processing gas exhaust passage, and the purge gas supplied from the purge gas supply passage is drawn into the processing chamber via the gas flowing gap due to a negative pressure inside the processing chamber caused by a difference between the flow rates.

In this case, the substrate processing apparatus may further comprise a buffer chamber that is provided so as to face the opening part of the purge gas supply passage along the circumferential direction of the processing chamber and temporarily accumulates the purge gas between the peripheral part of the container main body and the peripheral part of the cover body. Furthermore, the outflow passage may be provided in the container main body or the cover body and open to the gas flowing gap. Furthermore, the outflow passage may be provided in the container main body or the cover body and open to the gas flowing gap as well as to the buffer chamber. Furthermore, the outflow passage may be a gap formed between the peripheral part of the container main body and the peripheral part of the cover body at a position outside of the opening part of the purge gas supply passage. Furthermore, the processing gas exhaust passage may exhaust the processing chamber from an area above and outside of the substrate on the mounting board.

According to another aspect of the present invention, there is provided a method for processing a substrate. The method comprises the steps of mounting a substrate on a mounting board that is provided inside a container main body the upper part of which container main body is open; forming a processing chamber for the substrate in such a manner that the container main body is covered with a cover body with the peripheral part of the cover body coming close to the peripheral part of the container main body via a gap or with the peripheral part of the cover body coming into contact with the peripheral part of the container main body; supplying processing gas to the substrate on the mounting board from the central upper part of the processing chamber; exhausting the processing chamber from the area outside of the substrate on the mounting board when the processing gas is supplied into the processing chamber; and supplying purge gas from a purge gas supply passage that is open between the peripheral part of the container main body and the peripheral part of the cover body along the circumferential direction of the container main body. In this method, a supplied flow-rate of the processing gas into the processing chamber is made less than an exhaust flow-rate in the processing gas exhaust passage when the processing gas is supplied into the processing chamber so that the purge gas supplied from the purge gas supply passage is drawn into the processing chamber via a gas flowing gap formed from the opening part of the purge gas supply passage to the processing chamber along the circumferential direction of the processing chamber between the peripheral part of the container main body and the peripheral part of the cover body due to a negative pressure inside the processing chamber caused by a difference between the flow rates.

According to still another aspect of the present invention, there is provided a storage medium having stored therein a computer program for use in a substrate processing apparatus that supplies processing gas to a substrate in a processing chamber. In this storage medium, the program contains a group of steps for executing the method for processing the substrate described above.

According to an embodiment of the present invention, the supplied flow-rate of the processing gas into the processing chamber is made less than the exhaust flow-rate in the processing gas exhaust passage. Due to the negative pressure inside the processing chamber caused by the difference between the flow rates, purge gas is drawn into the processing chamber from the gap formed at the peripheral part of the processing chamber, thereby preventing the leakage of gas from the processing chamber. Furthermore, because the pressure inside the processing chamber is prevented from being negative due to the drawing of the purge gas into the processing chamber, the spreading of gas to the rear surface of a substrate is reduced.

BRIEF DESCRIPTION OF THE DRAWINGS

Other objects, features and advantages of the present invention will become more apparent from the following detailed description when read in conjunction with the accompanying drawings, in which:

FIG. 3A is a cross-sectional view showing an embodiment of a hydrophobic processing apparatus according to the present invention;

DETAILED DESCRIPTION OF THE PREFERRED EMBODIMENTS

Figure 3B:
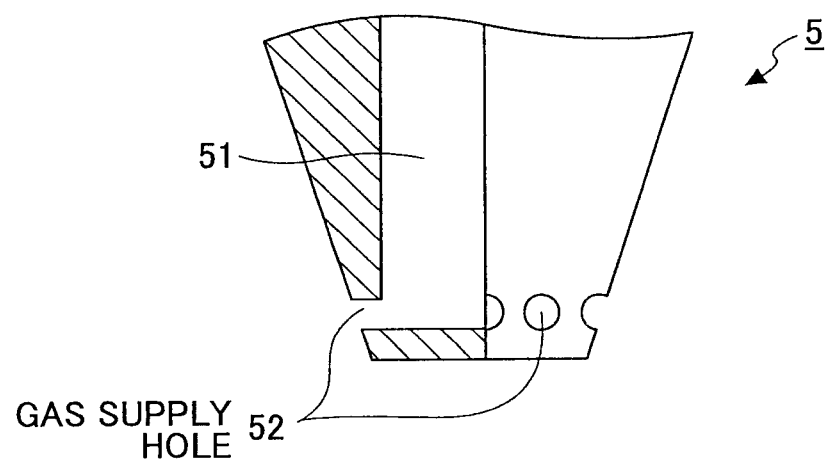
FIG. 3B is a cross-sectional view showing the embodiment of the hydrophobic processing apparatus according to the present invention.

A description is now made of a case in which a substrate processing apparatus according to an embodiment of the present invention is applied to a hydrophobic processing apparatus that performs hydrophobic processing on a substrate such as a wafer W. FIGS. 3A and 3B are vertical cross-sectional views of the hydrophobic processing apparatus. The hydrophobic processing apparatus has a container main body 2 the upper part of which is open and a cover body 3 provided to cover the upper opening of the container main body 2.

The container main body 2 has a side wall part 21, a bottom wall part 22, and a mounting board 4 for the wafer W provided to be supported on the bottom wall part 22. In this example, the bottom wall part 22 is formed up to an area where the peripheral part of the mounting board 4 is supported, and the mounting board 4 serves also as a part of the container main body 2. Here, the bottom wall part 22 may be configured to support the entire rear surface of the mounting board 4 so that the container main body 2 is composed of the side wall part 21 and the bottom wall part 22. Inside the mounting board 4, a heating unit (not shown) is provided.

On the other hand, the cover body 3 has a side wall part 31 and an upper wall part 32. In this example, the container main body 2 is covered with the cover body 3 so that the lower surface of the side wall part 31 serving as the peripheral part of the cover body 3 comes close to the upper surface of the side wall part 21 serving as the peripheral part of the container main body 2 via a gap G. Accordingly, the opening on the side of the upper part of the container main body 2 is closed by the cover body 3 to form a processing chamber 20 between them. Here, the gap G refers to a gap of about 0.5 mm through 2 mm formed between a part near the outer edge of the upper surface of the side wall part 21 of the container main body 2 and a part near the outer edge of the lower surface of the side wall part 31 of the cover body 3. The size in the height direction of the processing chamber 20 thus formed, i.e., a distance L1 (see FIG. 4) between the front surface of the mounting board 4 and the lower surface of the upper wall part 32 is, for example, about 3 mm through 10 mm.

In the mounting board 4, plural lifting pins 41 are provided to transfer the wafer W to and from an outer conveying unit (not shown). The lifting pins 41 are configured to be freely lifted up and down by a lifting mechanism 42. In FIG. 3A, reference numeral 43 denotes a cover that is provided on the rear surface of the mounting board 4 to surround the periphery of the lifting mechanism 42. The container main body 2 and the cover body 3 are configured to be freely lifted up and down relative to each other. In this example, the cover body 3 is configured to be freely lifted up and down between a processing position at which the cover body 3 is connected to the container main body 2 and a substrate conveying position located on the upper side of the container main body 2.

Furthermore, in the processing chamber 20, a processing gas supply part 5 is provided at, for example, the central part on the rear surface side of the cover body 3 so that processing gas is supplied from the central upper part of the processing chamber to the substrate on the mounting board 4. As shown in FIG. 3B, the processing gas supply part 5 is formed in a substantially trapezoidal shape the lower side of which is narrow in vertical cross section. In other words, the processing gas supply part 5 is of a tapered cylinder shape whose lower end surface is smaller than the upper end surface and has a substantially vertical gas passage 51. In the side surface of the processing gas supply part 5, multiple gas supply holes 52 having a diameter of, for example, about 0.5 mm through 0.2 mm are formed at predetermined intervals around the entire circumference of the side surface.

Moreover, in the cover body 3, a gas supply passage 33 connected to the gas passage 51 of the processing gas supply part 5 is formed. In this example, the gas supply passage 33 is formed so as to be bent on the upper side of the cover body 33 and extended in the substantially horizontal direction. The upstream end of the gas supply passage 33 is connected to both a supply source 62 of HMDS gas as hydrophobic processing gas and a supply source 63 of $N_2$ gas as substitution gas via the gas supply pipe 61.

The gas supply pipe 61 is provided with a first flow-rate regulation valve V1 that regulates the flow rate of supplied HMDS gas between the supply source 62 of HMDS gas and the gas supply passage 33 and provided with a second flow-rate regulation valve V2 that regulates the flow rate of supplied $N_2$ between the supply source 63 of $N_2$ gas and the gas supply passage 33. The flow-rate regulation valves V1 and V2 have an opening/closing function and a flow-rate regulating function. Through the flow-rate regulation valves V1 and V2, the gas supplied to the gas supply passage 33 is switched between HMDS gas and $N_2$ gas and each gas is supplied to the processing chamber 20 with its flow rate regulated.

Between the peripheral part of the container main body 2 and that of the cover body 3, a buffer chamber 7 is formed along the circumferential direction of the processing chamber 20. In this example, in the side wall part 31 of the cover body 3, the buffer chamber 7 is formed as an annular successive space for surrounding the wafer W mounted in the processing chamber 20 between the upper surface of the side wall part 21 of the container main body 2 and the lower surface of the side wall part 31 of the cover body 3.

In the buffer chamber 7, $N_2$ gas as purge gas is supplied via purge gas supply passages 71 and temporarily accumulated. The purge gas supply passages 71 have a diameter of, for example, about 0.5 mm through 2 mm and formed to be a substantially vertical so as to pass through the side wall part 21 of the container main body 2. When the processing chamber 20 is formed, multiple purge gas supply passages 71 are formed to be annularly arranged along the circumferential direction of the container main body 2 so that the downstream ends of the purge gas supply passages 71 are open to the buffer chamber 7. In this manner, the purge gas supply passages 71 are configured to be open between the peripheral part of the container main body 2 and that of the cover body 3 along the circumferential direction of the processing chamber 20.

Furthermore, at the lower surface of the container main body 2, an annular successive gas supply chamber 72 is provided so as to be connected to the upstream ends of the purge gas supply passages 71 along the circumferential direction of the container main body 2. The supply source (substitution gas supply part) 63 of $N_2$ gas as purge gas is connected to the gas supply chamber 72 via a purge gas supply pipe 73 provided with the third flow-rate regulation valve V3. In this example, the supply part that supplies purge gas is common to the one that supplies $N_2$ gas to the processing gas supply part 5, but different supply parts that supply the purge gas and the $N_2$ gas, respectively, may be provided.

Moreover, between the peripheral part of the container main body 2 and that of the cover body 3, a purge gas supply hole 74 that supplies the purge gas inside the buffer chamber 7 to the processing chamber 20 is in communication with the buffer chamber 7 and formed in the buffer chamber 7 along its circumferential direction. The purge gas supply hole 74 corresponds to a gas flowing gap formed from the opening parts of the purge gas supply passages 71 to the processing chamber 20 along the circumferential direction of the processing chamber 20. In this example, the purge gas supply hole 74 is the gap G formed between the upper surface of the side wall part 21 of the container main body 2 and the lower surface of the side wall part 31 of the cover body 3. The purge gas supply hole 74 is formed in a successive slit shape and has a size L2 of, for example, about 1 mm through 3 mm in the height direction (see FIG. 4).

Here in this example, the position in the height direction of the peripheral part of the container main body 2 is slightly (for example, about 1 mm through 3 mm) higher than the front surface of the wafer W on the mounting board 4. Therefore, the position in the height direction of the purge gas supply hole 74 is also slightly higher than the front surface of the wafer W on the mounting board 4.

On the other hand, the cover body 3 has exhaust passages 81 that exhaust the processing chamber 20 from a position outside the wafer W on the mounting board 4 when processing gas is supplied into the processing chamber 20 from the processing gas supply part 5. The exhaust passages 81 have a diameter of, for example, about 1 mm through 2 mm and are annularly formed at uniform intervals along the circumferential direction of the cover body 3 so that their upstream ends are open outside of the wafer W on the mounting board 4, for example, so that the upstream ends are open to the purge gas supply hole 74 in the side wall part 31. Here, a distance between the opening part of the exhaust passage 81 and the outer edge of the wafer W on the mounting board 4 is preferably, for example, about 20 mm through 40 mm.

Figure 4:
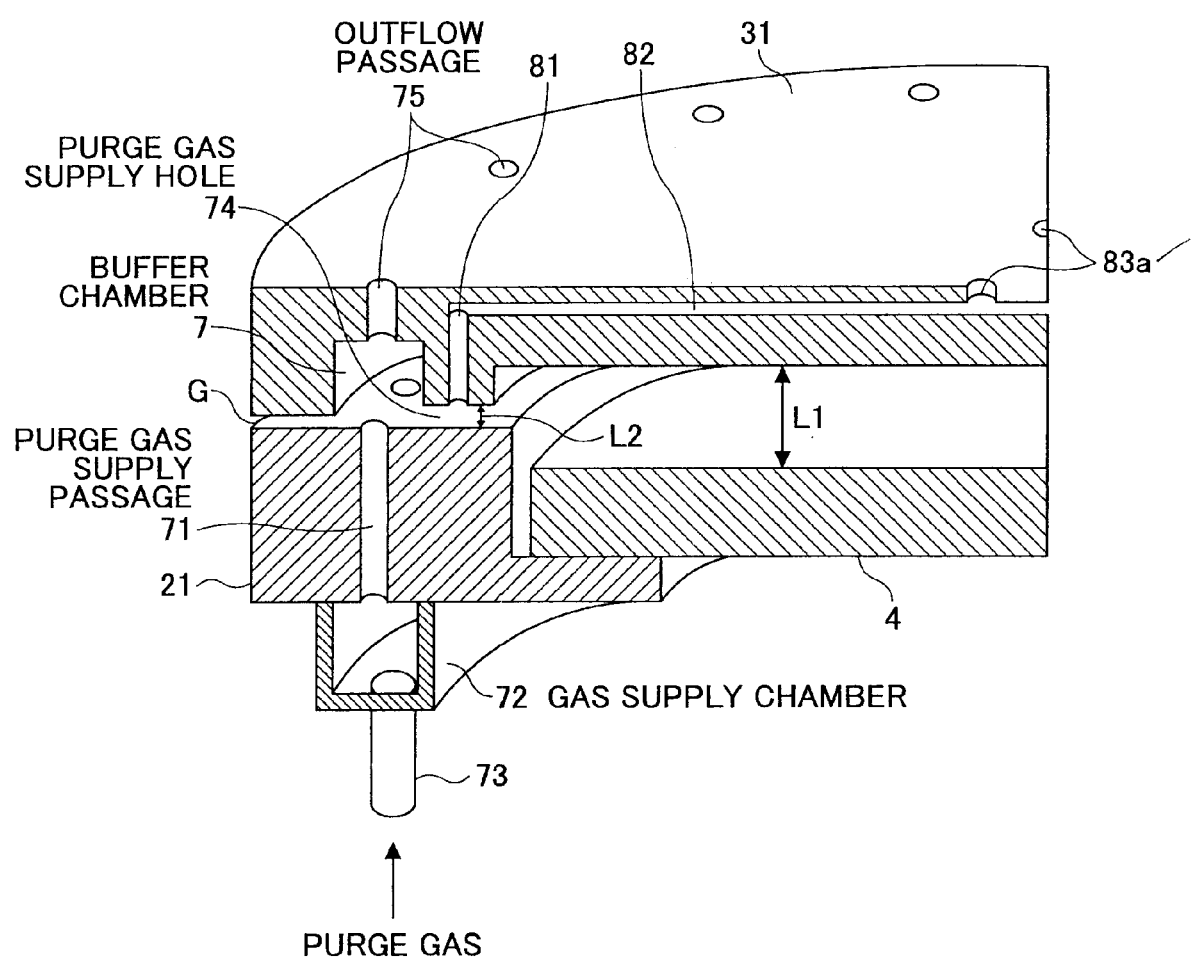
FIG. 4 is a perspective view showing a part of the hydrophobic processing apparatus.

Furthermore, in the upper wall part 32 of the cover body 3 is formed an extremely flat cavity part 82 that extends to an area other than the central area where the processing gas supply part 5 is provided in a planar shape, has a ring shape in a plane shape, and has a thickness of about 1 mm through 3 mm. The downstream ends of the exhaust passages 81 are connected to the cavity part 82. Moreover, plural, for example, six exhaust pipes 83 are connected to the cavity part 82 at an area near the center of the cover body 3, and the downstream ends of the exhaust pipes 83 are connected to an ejector serving as an exhaust unit 84 via an exhaust flow-rate regulation valve V4. In FIG. 4, reference numerals 83a denote exhaust ports connected to the exhaust pipes 83. In this example, a processing gas exhaust passage is composed of the exhaust passages 81 and the cavity part 82 formed in the cover body 3.

Also in the cover body 3, outflow passages 75 extending upward so as to pass through the cover body 3 from the buffer chamber 7 are provided at uniform intervals, for example, along the circumferential direction of the processing chamber 20. The outflow passages 75 are formed to eject to the outside of the processing chamber 20 the purge gas supplied between the peripheral part of the container main body 2 and that of the cover body 3 from the purge gas supply passages 71.

The hydrophobic processing apparatus is configured to be controlled by a control unit 9. The control unit 9 is, for example, a computer and has a program, a memory, and a CPU. The program has embedded therein commands (steps) that send a control signal from the control unit 9 to each unit of the hydrophobic processing apparatus to advance predetermined hydrophobic processing. The program is stored in a computer storage medium such as a flexible disk, a compact disk, a hard disk, and a MO (magnetooptic) disk, and it is installed in the control unit 9.

Here, the program contains steps that control a lifting mechanism 23 for the cover body 3, the exhaust unit 84, the flow-rate regulation valves V1, V2, and V3, and the exhaust flow-rate regulation valve V4. In accordance with a process recipe previously stored in the control unit 9, the driving of the lifting mechanism 23 and the exhaust unit 84 as well as the opening degrees of the valves V1 through V4 are controlled. As for the controlling of the flow-rate regulation valves V1, V2, and V3 and the exhaust flow-rate regulation valve V4 when the hydrophobic processing and the substitution processing are performed on the wafer W, the supplied flow-rate of HMDS gas or $N_2$ gas from the processing gas supply part 5 is made less than the exhaust flow-rate in the processing gas exhaust passage.

Referring to FIGS. 5 through 7A and 7B, a description is now made of a hydrophobic processing method according to the embodiment of the present invention. First, the process recipe of target hydrophobic processing is selected by the control unit 9. The control unit 9 outputs a control signal to each unit of the hydrophobic processing apparatus based on the process recipe. Then, the predetermined hydrophobic processing is performed on the wafer W.

Figure 6A:
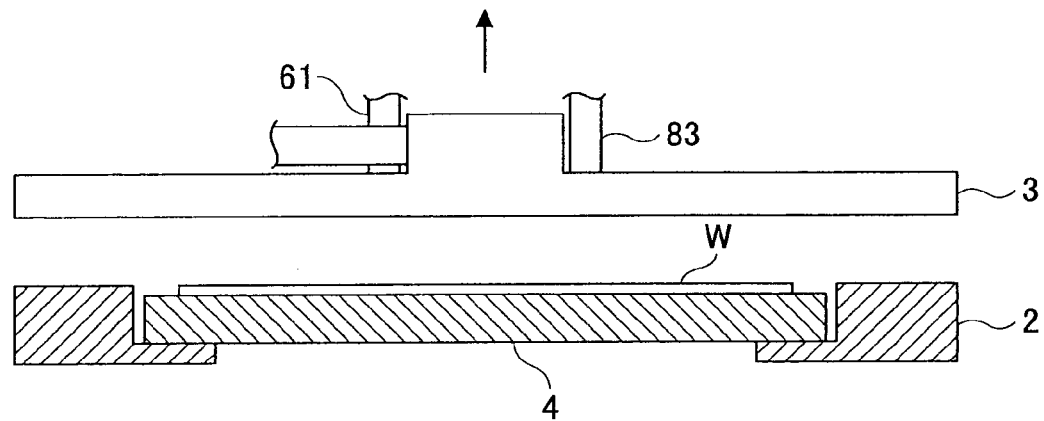
FIG. 6A is a process diagram showing the hydrophobic processing method used in the hydrophobic processing apparatus.

Specifically, as shown in FIG. 6A, after the cover body 3 is first lifted up to the substrate conveying position, the wafer W is conveyed into the processing chamber from the opening part thus formed (step S1) and then mounted on the mounting board 4 through a cooperative operation by the outer conveying unit (not shown) and the lifting pins 41. Next, as shown in FIG. 6B, the cover body 3 is lowered to the processing position to form the processing chamber 20.

Figure 6B:
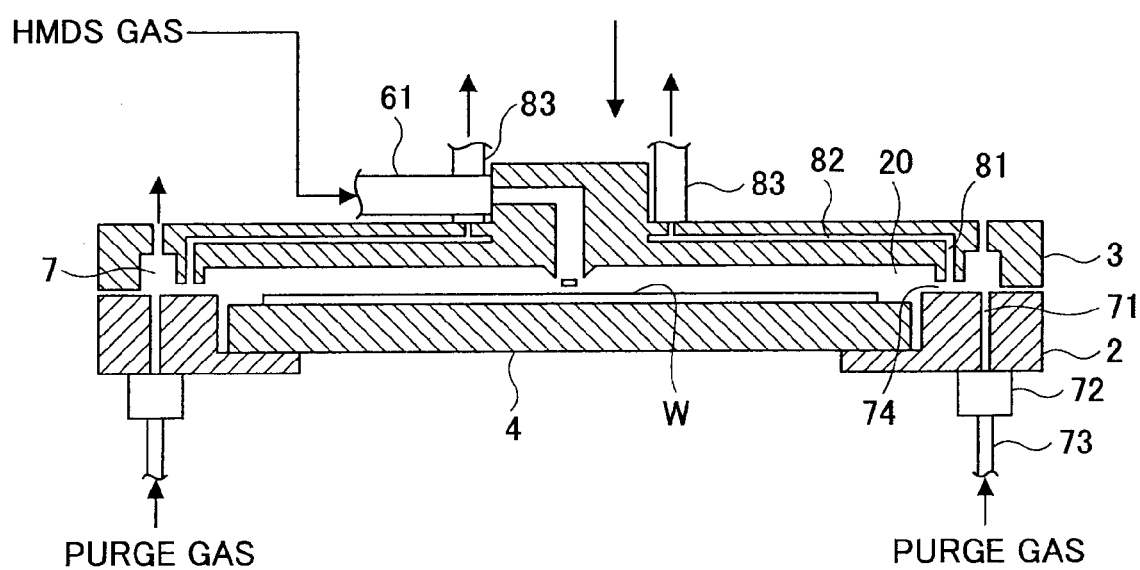
FIG. 6B is a process diagram showing the hydrophobic processing method used in the hydrophobic processing apparatus.

Then, as shown in FIG. 6B, HMDS gas is supplied into the processing chamber 20 to perform the hydrophobic processing (step S2). In the hydrophobic processing, the wafer W is heated, for example, to 90° C. by the heating unit incorporated in the mounting board 4, while the first flow-rate regulation valve V1 is opened to a predetermined opening degree to supply HMDS gas into the processing chamber 20 at a flow rate of, for example, about 3000 ccm. On the other hand, each of the third flow-rate regulation valve V3 and the exhaust flow-rate regulation valve V4 is opened to a predetermined opening degree, while the exhaust unit 84 is actuated to exhaust the processing chamber 20, for example, at an exhaust flow-rate of about 5000 ccm through 15000 ccm from the processing gas exhaust passage. In order to make the supplied flow-rate of the HMDS gas into the processing chamber 20 less than the exhaust flow-rate in the processing gas exhaust passage, the introduction of the HMDS gas into the processing chamber 20, the introduction of purge gas into the buffer chamber 7, and the exhausting of the processing chamber 20 are performed while the first flow-rate regulation valve V1 and the exhaust flow-rate regulation valve V4 are controlled. Under these conditions, the HMDS gas fills the processing chamber 20 to perform the hydrophobic processing on the wafer W for about 30 seconds. In this case, the supplied flow-rate of the purge gas is preferably about 5000 ccm through 15000 ccm.

Figure 7A:
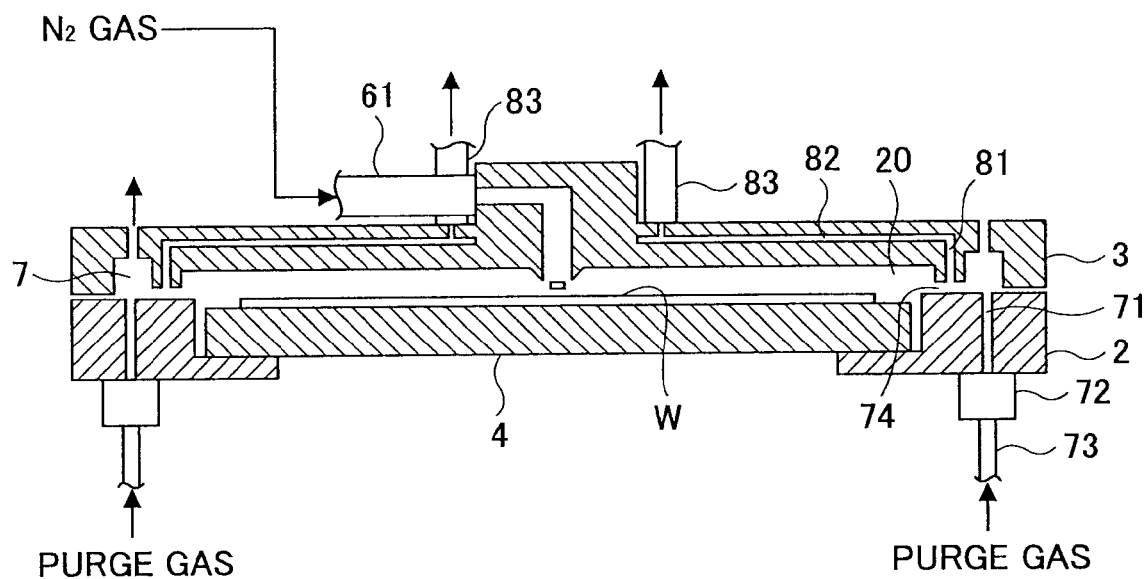
FIG. 7A is a process diagram showing the hydrophobic processing method used in the hydrophobic processing apparatus.
Figure 7B:
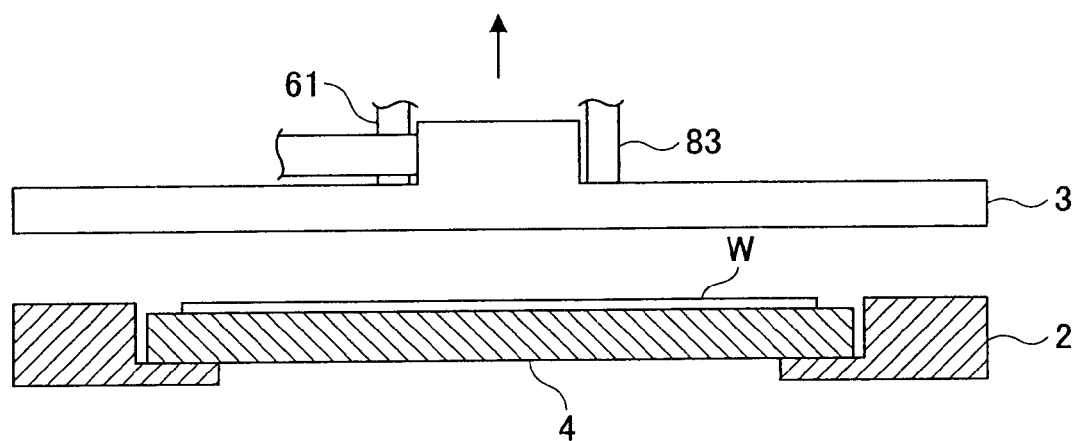
FIG. 7B is a process diagram showing the hydrophobic processing method used in the hydrophobic processing apparatus.

Subsequently, as shown in FIG. 7A, $N_2$ gas is supplied into the processing chamber 20 to perform the substitution processing (step S3). That is, the first flow-rate regulation valve V1 is closed and the second flow-rate regulation valve V2 is opened to a predetermined degree so that the $N_2$ gas is supplied into the processing chamber 20, for example, at a flow rate of about 3000 ccm through 10000 ccm. On the other hand, the third flow-rate regulation valve V3, the exhaust flow-rate regulation valve V4, and the exhaust unit 84 are operated as in the case of the hydrophobic processing. In order to make the supplied flow-rate of the $N_2$ gas into the processing chamber 20 less than the exhaust flow-rate in the processing gas exhaust passage, the introduction of the $N_2$ gas into the processing chamber 20, the introduction of purge gas into the buffer chamber 7, and the exhausting of the processing chamber 20 are performed while the second flow-rate regulation valve V2 and the exhaust flow-rate regulation valve V4 are controlled. Under these conditions, the substitution processing is performed for about 10 seconds. In this case, the flow rate of the purge gas introduced into the buffer chamber 7 is the same as the flow rate during the hydrophobic processing. After the processing chamber 20 is filled with the substitution gas, the flow-rate regulation valves V2, V3 and the exhaust flow-rate regulation valve V4 are closed, while the exhaust unit 84 is stopped. Then, the cover body 3 is lifted up to the substrate conveying position, and the wafer W is taken out (see FIG. 7B, step S4).

Figure 8:
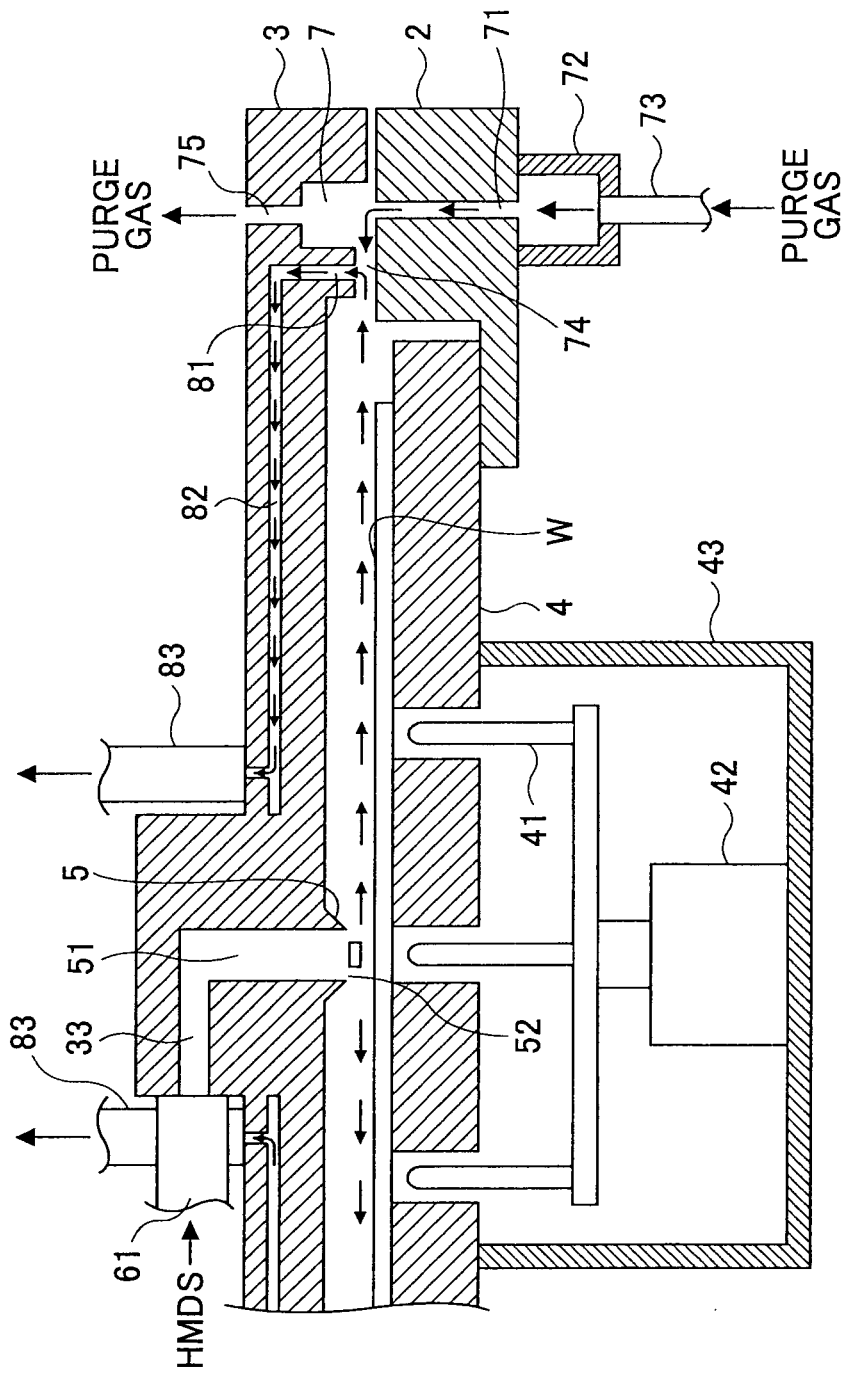
FIG. 8 is a partial cross-sectional view showing the flow of gas in the hydrophobic processing apparatus.

Referring to FIG. 8, a description is now made of the flow of gas in the processing chamber exemplifying a case in which HMDS gas is supplied from the processing gas supply part 5. The HMDS gas is supplied above the central part of the wafer W on the mounting board 4 and exhausted from the exhaust passages 81 open at an area above and outside of the wafer W and inside of the buffer chamber 7. Therefore, the HMDS gas is dispersed from the central part to the outer edge part on the side above the wafer W and fills the processing chamber 20. In this manner, the hydrophobic processing is performed on the areas such as the front surface and the outer edge of the wafer W where the HMDS gas contacts.

On the other hand, the purge gas is supplied from the purge gas supply passages 71 to the buffer chamber 7. As described above, each of the first flow-rate regulation valve V1 and the exhaust flow-rate regulation valve V4 is controlled in order to make the exhaust flow-rate in the processing gas exhaust passage greater than the supplied flow-rate of the HMDS gas from the processing gas supply part 5 in the processing chamber 20. Therefore, the pressure inside the processing chamber 20 becomes negative due to the difference between the supplied flow-rate of the HMDS gas and the exhaust flow-rate. As a result, the purge gas in the buffer chamber 7 is drawn into the periphery of the processing chamber 20 via the purge gas supply hole 74 due to the negative pressure inside the processing chamber 20. As a result, the purge gas is drawn from the purge gas supply hole 74 into the periphery of the processing chamber 20 at all times and exhausted via the exhaust passages 81 together with the HMDS gas.

Moreover, the outflow passages 75 are formed in the buffer chamber 7. Therefore, when the supplied flow-rate of the purge gas into the buffer chamber 7 is excessive, the purge gas is ejected from the outflow passages 75 to maintain the pressure inside the processing chamber 20 at almost atmospheric pressure. Note that the purge gas ejected from the outflow passages 75 is exhausted to outside of the apparatus via an exhaust passage provided in a housing (not shown) in which the hydrophobic processing apparatus is accommodated. In order to supply the purge gas from the buffer chamber 7 into the processing chamber 20 at all times, it is necessary to make the supplied flow-rate of the purge gas into the buffer chamber 7 greater than the drawn flow-rate of the purge gas drawn from the buffer chamber 7 into the processing chamber 20. Therefore, the supplied flow-rate of the purge gas is set in consideration of the supplied flow-rate of the HMDS gas into the processing chamber 20 and the exhaust flow-rate in the processing chamber 20. In this case, even if the supplied flow-rate of the purge gas into the buffer chamber 7 is excessive, it does not much matter because the purge gas is ejected from the outflow passages 75 to the outside of the processing chamber 20.

The flow of $N_2$ gas during the substitution processing is similar to that of the HMDS gas during the hydrophobic processing, and the exhaust flow-rate in the processing gas exhaust passage is made greater than the supplied flow-rate of the $N_2$ gas from the processing gas supply part 5. Therefore, the purge gas in the buffer chamber 7 is drawn into the periphery of the processing chamber 20 due to the negative pressure inside the processing chamber 20 caused by the difference between the supplied flow-rate of the $N_2$ gas and the exhaust flow-rate and then exhausted via the exhaust passages 81 together with the $N_2$ gas. Furthermore, the excessive purge gas in the buffer chamber 7 is ejected to the outside of the processing chamber 20 via the outflow passages 75. Thus, the pressure inside the processing chamber 20 is maintained at almost atmospheric pressure.

In the hydrophobic processing apparatus according to the embodiment of the present invention, the purge gas is thus drawn into the periphery of the processing chamber 20 from the gap (purge gas supply hole 74) formed along the circumferential direction of the processing chamber 20 between the peripheral part of the container main body 2 and that of the cover body 3 during the hydrophobic processing and the substitution processing. Therefore, as viewed from the inner side of the processing chamber 20, the airflow of the purge gas is introduced from the gap between the container main body 2 and the cover body 3 at the periphery of the processing chamber 20 at all times so as to surround the processing chamber 20, thereby generating the air curtain of the purge gas. Accordingly, the air curtain hinders the HMDS gas and the $N_2$ gas in the processing chamber 20 from entering the gap between the container main body 2 and the cover body 3, thus preventing the leakage of the HMDS gas or the like to the outside of the processing chamber 20. Therefore, the leakage of the gas in the processing chamber 20 through the gap between the container main body 2 and the cover body 3 is prevented without sealing the processing chamber 20.

As described above, according to the embodiment of the present invention, it is not necessary to seal the processing chamber 20 in order to perform the hydrophobic processing and the substitution processing. Therefore, the mechanism of sealing the processing chamber 20 is not required, and only one exhaust unit is used. As a result, the number of components used such as constituent components and utility components is reduced to make the cost of the components inexpensive. Furthermore, because the simplification of the structure can be attained, the assembling operation of the apparatus becomes easy. In addition, because the structure of the apparatus is simplified, an error in assembling the apparatus is not easily caused. Therefore, an operation for adjusting the error and an inspection process and a management process to determine the presence or absence of error in assembling the apparatus can also be simplified. As a result, the burden on an operator can be reduced. In addition, energy costs can be reduced along with the elimination of the mechanism for sealing the processing chamber 20.

Figure 1:
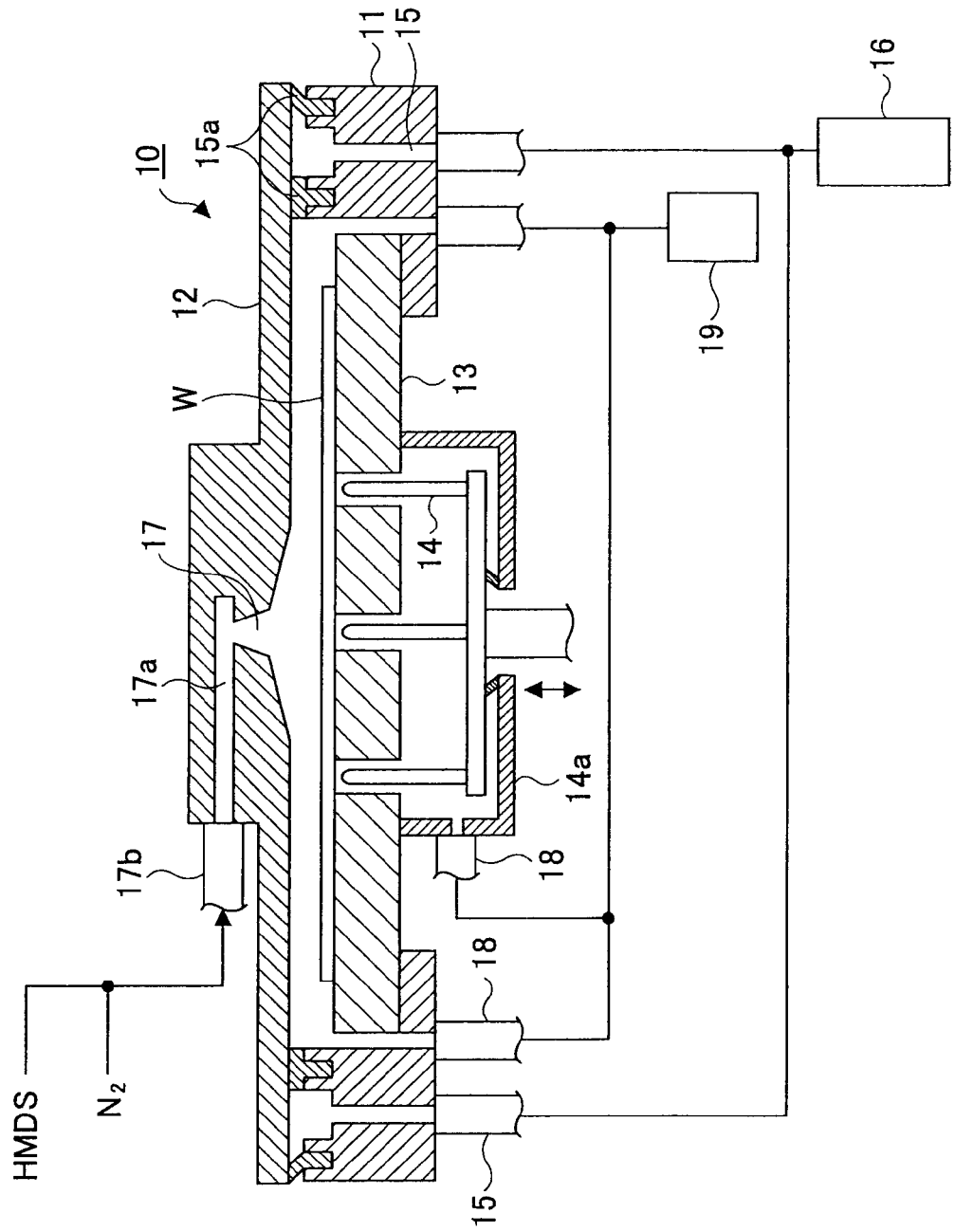
FIG. 1 is a cross-sectional view showing a conventional hydrophobic processing apparatus.
Figure 2:
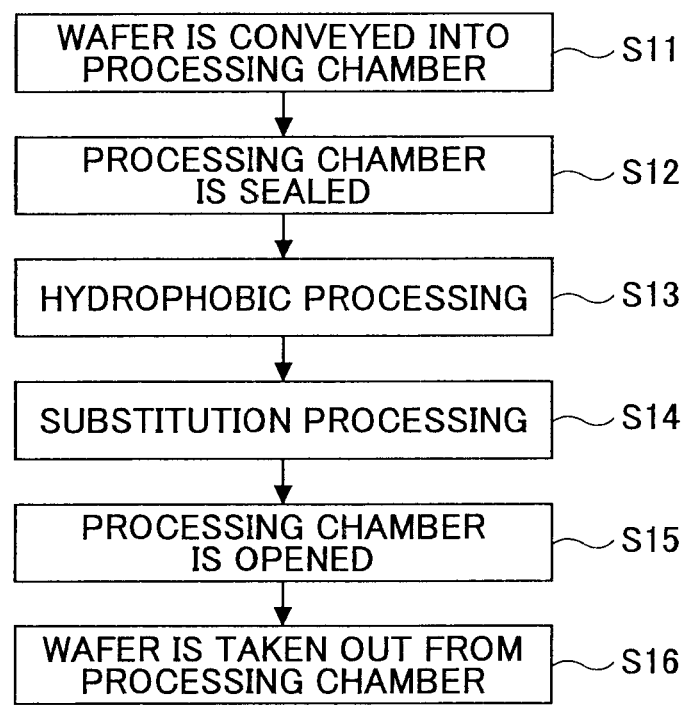
FIG. 2 is a process chart showing a conventional hydrophobic processing method.
Figure 5:
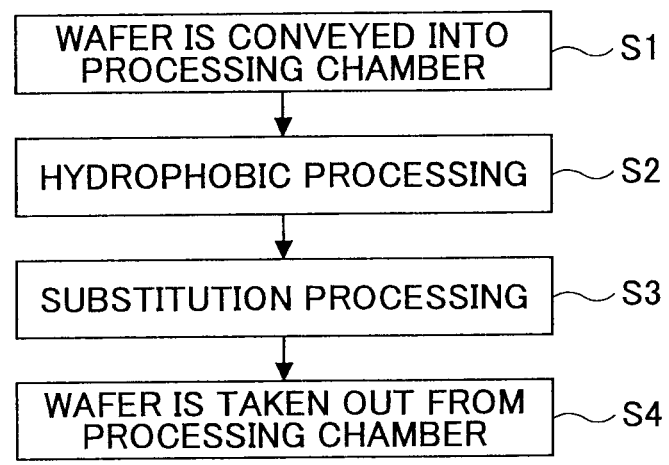
FIG. 5 is a process chart showing a hydrophobic processing method used in the hydrophobic processing apparatus.

Moreover, because it is not necessary to seal the processing chamber 20, conventional steps such as a step for sealing the processing chamber 20 after the wafer W is conveyed into the processing chamber 20 and a step for opening the processing chamber 20 before the wafer W is taken out from the processing chamber 20 (see FIG. 2) after the substitution processing are not required. Therefore, as shown in FIG. 5, a step for the hydrophobic processing is performed in the order of "the wafer W is conveyed into the processing chamber 20," "hydrophobic processing," "substitution processing," and "the wafer W is taken out from the conveying chamber 20," which can reduce the number of processing steps. Accordingly, total processing time can be reduced compared with conventional methods, and throughput can be enhanced.

Furthermore, according to the embodiment of the present invention, the outflow passages 75 are provided in the buffer chamber 7. With the outflow passages 75, the exhaust flow-rate in the processing gas exhaust passage is made greater than the supplied flow-rate of the HMDS gas into the processing chamber 20 and the supplied flow-rate of the purge gas into the buffer chamber 7 is made greater than the flow rate of the purge gas drawn from the buffer chamber 7 into the periphery of the processing chamber 20. Accordingly, the purge gas is supplied from the buffer chamber 7 into the periphery of the processing chamber 20 so that the pressure inside the processing chamber 20 automatically becomes atmospheric pressure, thereby making it easy to perform pressure control for maintaining the pressure inside the processing chamber 20 at atmospheric pressure.

As described above, the pressure inside the processing chamber 20 is prevented from being negative during the hydrophobic processing and the substitution processing. Therefore, the occurrence of a phenomenon in which the HMDS gas spreads to the rear surface of the wafer W can be prevented. As a result, the hydrophobic processing on the rear surface of the wafer W is prevented. Accordingly, because the hydrophobic processing on the rear surface of the wafer W is prevented, the rear surface can be quickly cleansed by paint thinner in a step for removing a stain from the rear surface of the wafer W after the application of a resist liquid. As a result, the step can be performed simply.

Moreover, the exhaust passages 81 are formed so as to be open in the cover body 3 above the outer edge of the wafer W. Therefore, in the processing chamber 20, the HMDS gas flows from the central part of the wafer W to the outer edge part thereof above the wafer W and then further moves up via the exhaust passages 81 inside of the buffer chamber 7. As described above, in the processing chamber 20, the gas flows from the central part of the wafer W to the outer edge part thereof and then further moves upward. Therefore, the gas hardly flows toward the rear surface of the wafer W. As a result, in this respect also, the occurrence of a phenomenon in which the HMDS gas spreads to the rear surface of the wafer W can be prevented.

Furthermore, the processing gas exhaust passage has the upstream ends opened outside of and above the wafer W on the mounting board 4, is formed to be bent and extended in the cover body 3, and is connected to the exhaust pipes 83 provided near the central part of the cover body 3. With this configuration, the processing gas exhaust passage can be made long. Therefore, the gas can be exhausted more uniformly.

In addition, the purge gas is temporarily accumulated in the ring-shaped gas supply chamber 72 and then supplied from the gas supply chamber 72 into the buffer chamber 7 via the purge gas supply passages 71 provided at the upper part of the gas supply chamber 72 along the circumferential direction. Accordingly, the purge gas in the gas supply chamber 72 is uniformly supplied into the buffer chamber 7 in the circumferential direction via the purge gas supply passages 71. Therefore, the purge gas is drawn into the periphery of the processing chamber 20 at an almost uniform supplied flow-rate from the purge gas supply hole 74 to the circumference of the processing chamber 20.

Furthermore, the HMDS gas and the $N_2$ gas supplied from the processing gas supply part 5 are supplied into the processing chamber 20 via the gas supply holes 52 provided in the circumferential direction of the processing gas supply part 5. Therefore, the HMDS gas and the $N_2$ gas are supplied in such a manner as to be slowly dispersed from the central part of the processing chamber 20 to the peripheral part thereof while being fed from the gas supply holes 52. Thus, unlike a conventional configuration in which gas is blown in spray form, there is no likelihood of causing air turbulence and generating a turbulent flow in the processing chamber 20. Accordingly, the gas is quickly dispersed from the central part of the processing chamber 20 to the peripheral part thereof. Therefore, the HMDS gas and the $N_2$ gas spread in the processing chamber 20 more uniformly, and a nonuniform concentration of the HMDS gas hardly occurs in the plane of the wafer W during the hydrophobic processing. As a result, the hydrophobic processing having high in-plane uniformity can be performed. Also during the substitution processing, the HMDS gas is quickly substituted for the $N_2$ gas, and nonuniform progression degree of the substitution processing hardly occurs in the plane of the wafer W. As a result, the time required for the substitution processing can be reduced.

Furthermore, it is conceivable that the processing chamber 20 becomes deformed for some reasons during its usage, thereby making the gap G at the peripheral part of the processing chamber 20 nonuniform in the circumferential direction. In this case, there is a likelihood of causing air turbulence in the processing chamber 20 and the inflow of air from outside of the hydrophobic processing apparatus. In this example, however, the position of the opening parts of the exhaust passages 81 outside of the processing chamber 20 are formed near the buffer chamber 7 of the side wall part 31 of the cover body 3 so as to make the distance between the opening parts of the exhaust passages 81 and the outer edge of the wafer W as small as possible. Therefore, even if the gap G becomes nonuniform, a balance between the flow rate of the gas inside the processing chamber 20 and the flow rate of the purge gas introduced from the buffer chamber 7 can be kept easily. As a result, uniform hydrophobic processing can be stably performed while preventing air turbulence in the processing chamber 20. Moreover, even if air flows in from outside of the hydrophobic processing apparatus, it is immediately ejected through the exhaust passages 81 because the distance between the opening parts of the exhaust passages 81 and the inner edge of the buffer chamber 7 is small. As a result, the inflow of the air into a part near the wafer W can be prevented.

Figure 9:
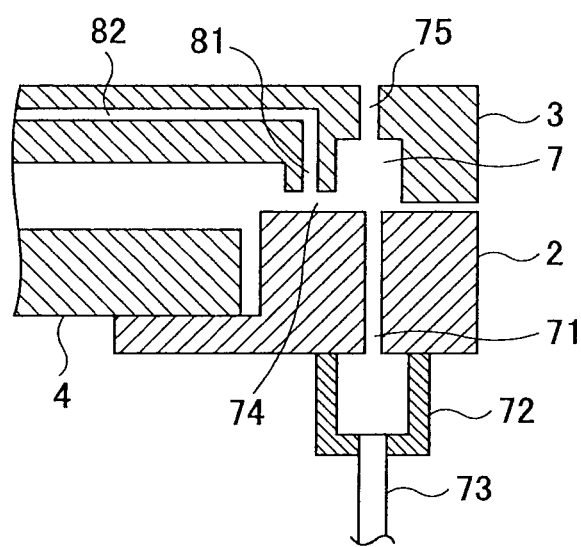
FIG. 9 is a partial cross-sectional view showing another example of the hydrophobic processing apparatus.

However, the opening parts of the exhaust passages 81 outside of the processing chamber 20 may only be positioned outside of the wafer W mounted in the processing chamber 20 as well as inside the purge gas supply passages 71. Alternatively, as shown in FIG. 9, the opening parts may be formed at the upper wall part 32 of the cover body 3.

Figure 10:
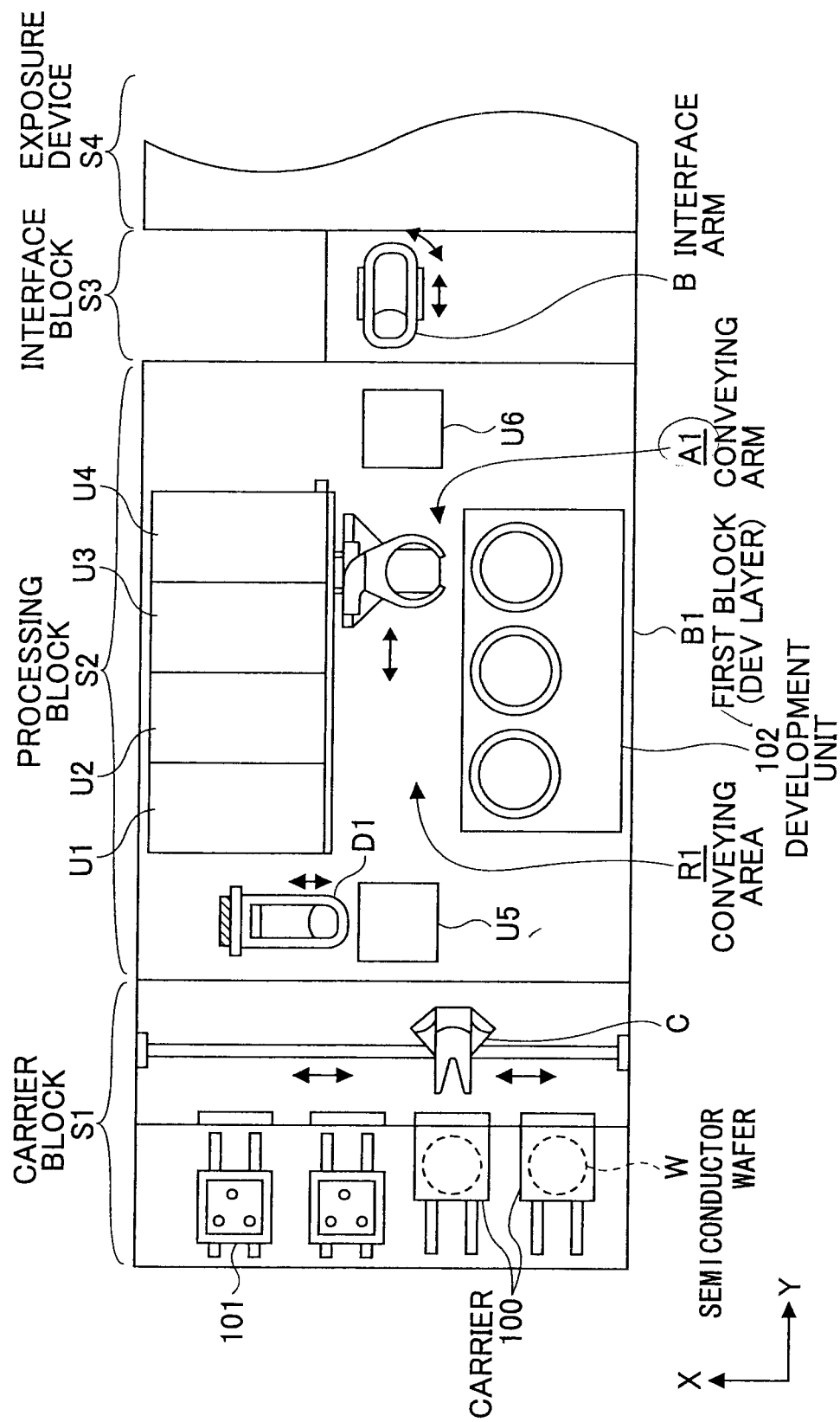
FIG. 10 is a plan view showing a resist pattern forming apparatus incorporating the hydrophobic processing apparatus.
Figure 11:
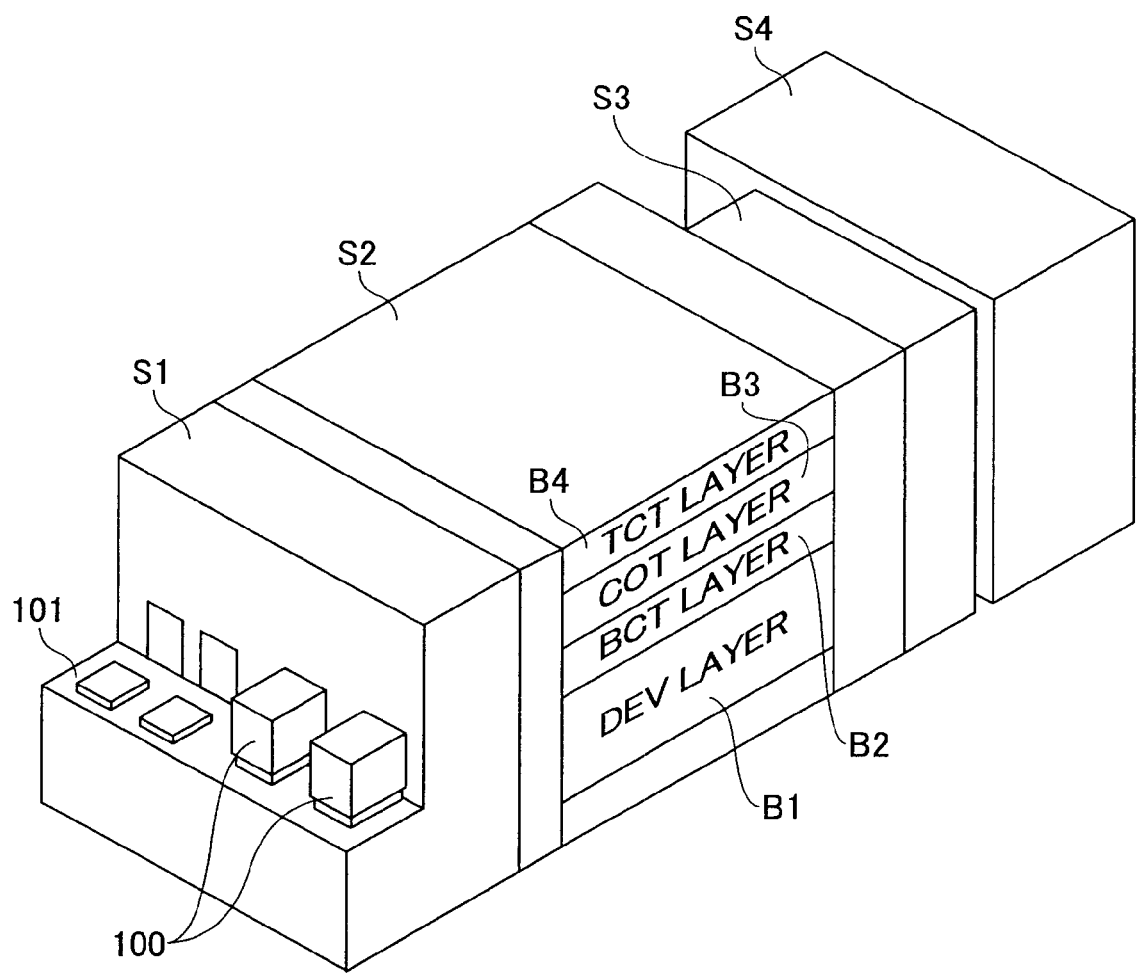
FIG. 11 is a perspective view showing the resist pattern forming apparatus.

Next, a description is briefly made of an example of a resist pattern forming system in which an exposure unit (exposure device) is connected to a coating and development apparatus incorporating the hydrophobic processing apparatus. FIGS. 10 and 11 are a plan view of the system and a perspective view thereof, respectively. The apparatus is provided with a carrier block S1, where a transferring arm C not only takes out the wafer W from a hermetically-sealed carrier 100 mounted on the mounting board 101 and transfers it to a processing block S2 adjacent to the block S1, but also receives the wafer W processed by the processing block S2 and returns it to the carrier 100.

As shown in FIG. 11, in this example, the processing block S2 has a first block (DEV layer) B1 that performs a development process, a second block (BCT layer) B2 that performs a forming process for a reflection preventing film to be formed on the lower layer side of a resist film, a third block (COT layer) B3 that performs a coating process for a resist liquid, and a fourth block (TCT layer) B4 that performs a forming process for a reflection preventing film to be formed on the upper layer side of the resist film. These blocks are laminated together in the processing blocks S2 in an ascending order from the first block (DEV layer) B1, the second block (BCT layer) B2, the third block (COT layer) B3, and the fourth block (TCT layer) B4.

Figure 12:
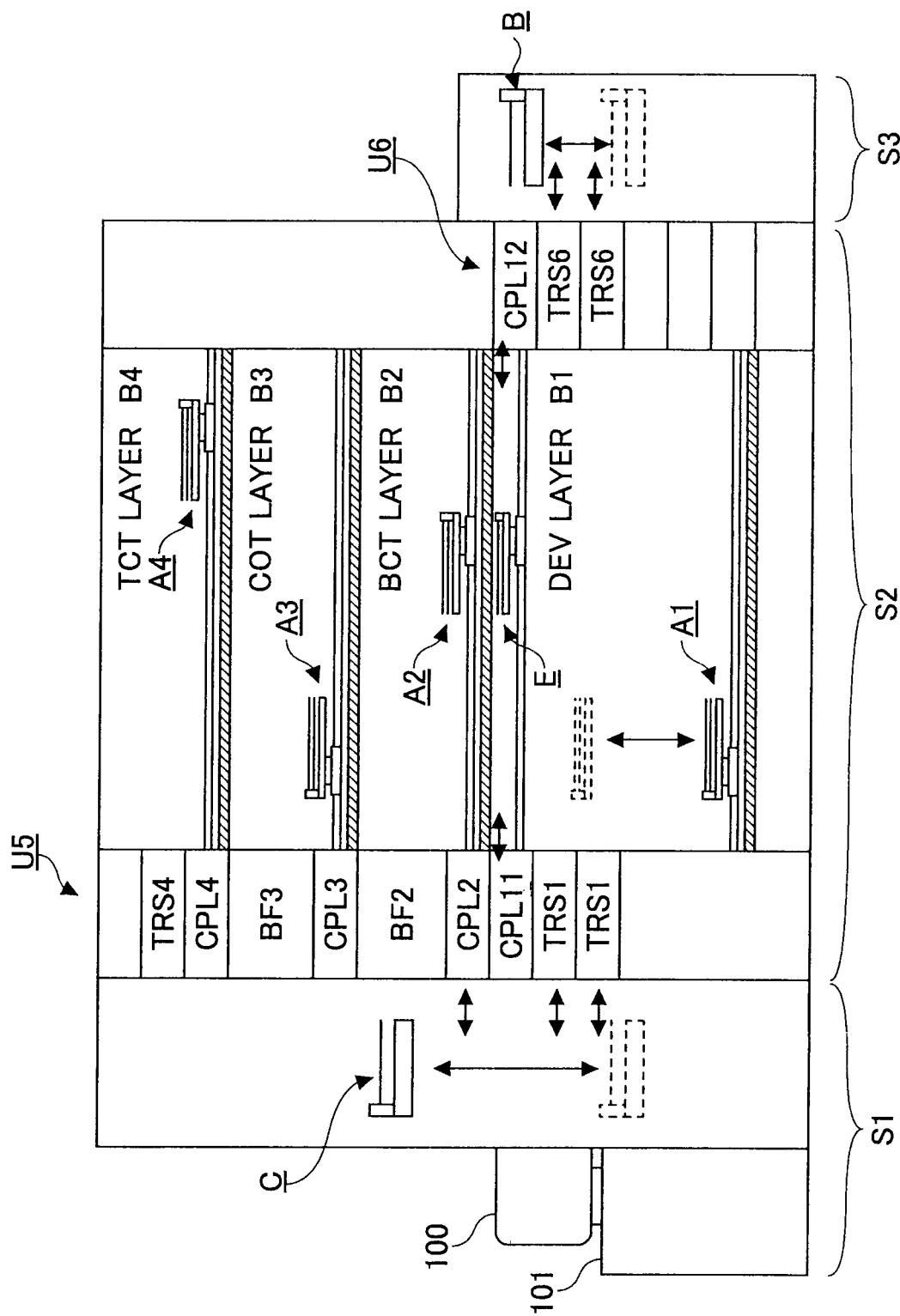
FIG. 12 is a cross-sectional view showing the resist pattern forming apparatus.

Each of the second block (BCT layer) B2 and the fourth block (TCT layer) B4 has a coating unit that coats a chemical solution for forming the reflection preventing film using a spin-coating process, a heating-and-cooling processing unit group that performs pre-processing and post-processing for the processing performed in the coating unit, and conveying arms A2 and A4 (see FIG. 12) that transfer the wafer W between the coating unit and the heating-and-cooling process unit group. The third block (COT layer) B3 uses a resist liquid as the chemical solution and has the same configuration as those of the second and fourth blocks except that it incorporates the hydrophobic processing apparatus. On the other hand, the processing block (DEV layer) B1 has the two-tiered development units 102, for example, in its single layer. The DEV layer B1 is provided with a common conveying arm A1 that conveys the wafer W to the two-tiered development units 102. As shown in FIGS. 10 and 12, the processing block S2 is further provided with a shelf unit U5, and the wafer W is conveyed between the components of the shelf unit U5 via a transferring arm D1 that is provided near the shelf unit U5 and can be freely lifted up and down.

In such a resist pattern forming apparatus, the wafer W from the carrier block S1 is successively conveyed into one transferring unit of the shelf unit U5, for example, a corresponding transferring unit CPL2 of the second block (BCT layer) B2 via a transferring arm C. Then, the wafer W is conveyed into the third block (COT layer) B3 via the transferring unit CPL3 and the conveying arm A3. In the third block, the hydrophobic processing is performed on the front surface of the wafer W to have a resist film formed thereon. The wafer W on which the resist film is formed is transferred to a transferring unit BF3 of the shelf unit U5 by the conveying arm A3.

Then, the wafer W is transferred to a conveying arm A4 via the transferring unit BF3, the transferring arm D1, and a transferring unit CPL4 in this order. After the reflection preventing film is formed on the resist film, the wafer W is transferred to a transferring unit TRS4 by the conveying arm A4. Note that where the reflection preventing film is not formed on the resist film, or instead of performing the hydrophobic processing on the wafer W, the reflection preventing film may be formed in the second block (BCT layer) B2.

On the other hand, at the upper part of the DEV layer B1, a shuttle arm E as a dedicated conveying unit is provided to directly convey the wafer W from the transferring unit CPL11 provided in the shelf unit U5 to the transferring unit CPL12 provided in the shelf unit U6. The wafer W on which the resist layer and the reflection preventing film are formed is transferred to the transferring unit CPL11 by the transferring arm D1 via the transferring units BF3 and TRS4. From the transferring unit CPL11, the wafer W is directly conveyed into the transferring unit CPL12 of a shelf unit U6 and then taken into an interface block S3. Note that in FIG. 12 the transferring units as denoted by "CPL" serve also as cooling units for temperature regulation and those denoted by "BF" serve also as buffer units on which plural of the wafers W can be mounted.

Subsequently, the wafer W is conveyed into the exposure device S4 by an interface arm B. After being subjected to predetermined exposure processing here, the wafer W is mounted on a transferring unit TRS6 of the shelf unit U6 and returned to the processing block S2. The returned wafer W is developed in the first block (DEV layer) B1, conveyed to a transferring board within an access range of the transferring arm C in the shelf unit U5 by the conveying arm A1, and returned to the carrier 100 via the transferring arm C. Note that in FIG. 10 symbols U1 through U4 denote a group of processing units, each of which has a heating unit, cooling unit, etc., that are laminated together, and the hydrophobic processing apparatus is incorporated in the group of processing units in the third block (COT layer) B3.

According to the embodiment of the present invention, examples of the processing gas supplied from the processing gas supply part 5 into the processing chamber 20 include substitution gas other than HMDS gas. Furthermore, in the hydrophobic processing apparatus of the present invention, the processing chamber 20 may be formed in such a manner that the opening on the upper side of the container main body 2 is covered with the cover body 3 so that the peripheral part of the container main body 2 and that of the cover body 3 come into contact with each other.

Furthermore, the buffer chamber 7 may be formed on the side of the container main body 2 so long as it is provided to face the opening parts of the purge gas supply passages 71 along the circumferential direction of the processing chamber 20 at the peripheral parts of the container main body 2 and the cover body 3. The shape of the buffer chamber 7 is not limited to the above example so long as the buffer chamber 7 is configured to temporarily accumulate purge gas.

Moreover, instead of providing the buffer chamber 7, the purge gas supply passages 71 may be provided between the peripheral part of the container main body 2 and that of the cover body 3 so as to be open along the circumferential direction of the processing chamber 20, whereby a gap for flowing gas is formed from the opening parts of the purge gas supply passages 71 to the inside of the processing chamber 20 along the circumferential direction of the processing chamber 20. Furthermore, the outflow passages 75 for purge gas are only required to be provided in the container main body 2 or the cover body 3 and open to the gap for flowing the gas, and it may be a gap formed between the peripheral part of the container main body 2 and that of the cover body 3 at the position outside of the opening parts of the purge gas supply passages 71.

The supplied flow-rate of processing gas from the processing gas supply part 5 may be regulated by a mass flowmeter, and the exhaust flow-rate in the processing gas exhaust passage may be controlled by the output of the exhaust unit 84. In this case, both of the supplied flow-rate of the processing gas and the supplied flow-rate in the processing gas exhaust passage may be controlled, or the supplied flow-rate of the processing gas may be controlled with the exhaust flow-rate in the processing gas exhaust passage being constant.

The present invention can be applied to substrate processing for an oven that performs processing at a low oxygen concentration other than the hydrophobic processing. Furthermore, the present invention can be applied to processing for a LCD substrate, a mask substrate, etc., other than the semiconductor wafer W.

EXAMPLE

A description is now made of an example performed for confirming the effect of the embodiment of the present invention. In the following experiments, the hydrophobic processing apparatus shown in FIGS. 3A and 3B is used.

The wafer W is conveyed into the hydrophobic processing apparatus and then subjected to hydrophobic processing for 30 minutes on the conditions that the flow rate of HMDS gas is 3000 ccm, the temperature of the wafer W is 90° C., the exhaust flow-rate in the processing gas exhaust passages is 10000 ccm, and the flow rate of purge gas is 10000 ccm. Next, the wafer W is subjected to substitution processing for 10 minutes on the conditions that the flow rate of $N_2$ gas is 5000 ccm, the exhaust flow-rate in the processing gas exhaust passages is 10000 ccm, and the flow rate of purge gas is 10000 ccm, and then it is taken out. The contact angles of two wafers W1 and W2 are measured to evaluate whether the rear surfaces of the wafers W1 and W2 have been subjected to the hydrophobic processing.

In order to measure the contact angles, a DropMaster 500R (manufactured by KYOWA INTERFACE SCIENCE, CO., LTD.) is used, and pure water and cyclohexanone are used as a measurement solvent. Furthermore, the measurement of the contact angles is conducted with respect to 31 points on a first line passing through the center of the wafer W and a notch and located inside 5 mm away from the outer edge of the wafer W, and 31 points on a second line passing through the center of the wafer W orthogonal to the first line and located inside 5 mm away from the outer edge of the wafer W. Here, the contact angle of an area of the wafer W that has not been subjected to the hydrophobic processing approximates zero degrees, while that of an area of the wafer W that has been subjected to the hydrophobic processing increases.

Figure 13A:
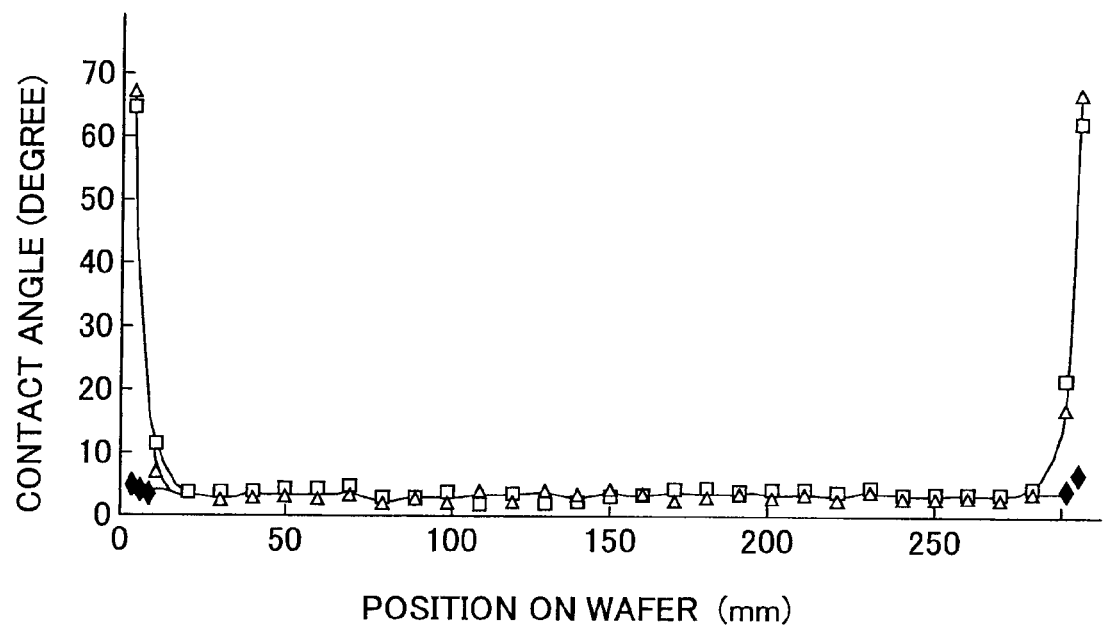
FIG. 13A is a characteristic diagram showing the measurement data of contact angles on the rear surface of a wafer W, which are obtained to confirm the effect of the present invention.
Figure 13B:
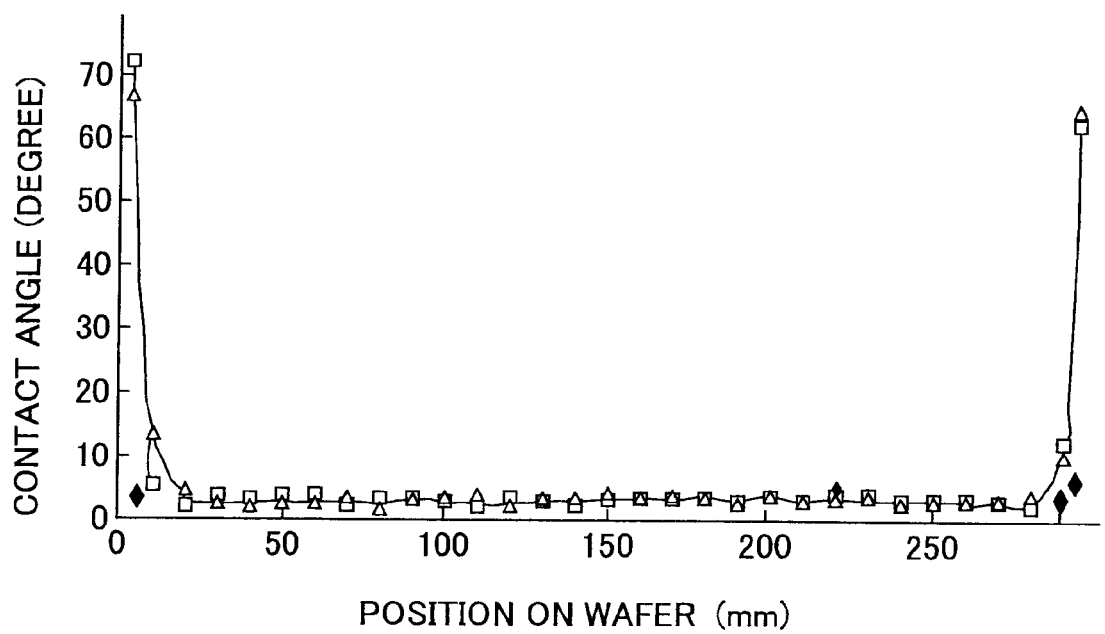
FIG. 13B is a characteristic diagram showing the measurement data of the contact angles on the rear surface of the wafer W, which are obtained to confirm the effect of the present invention.
Figure 14A:
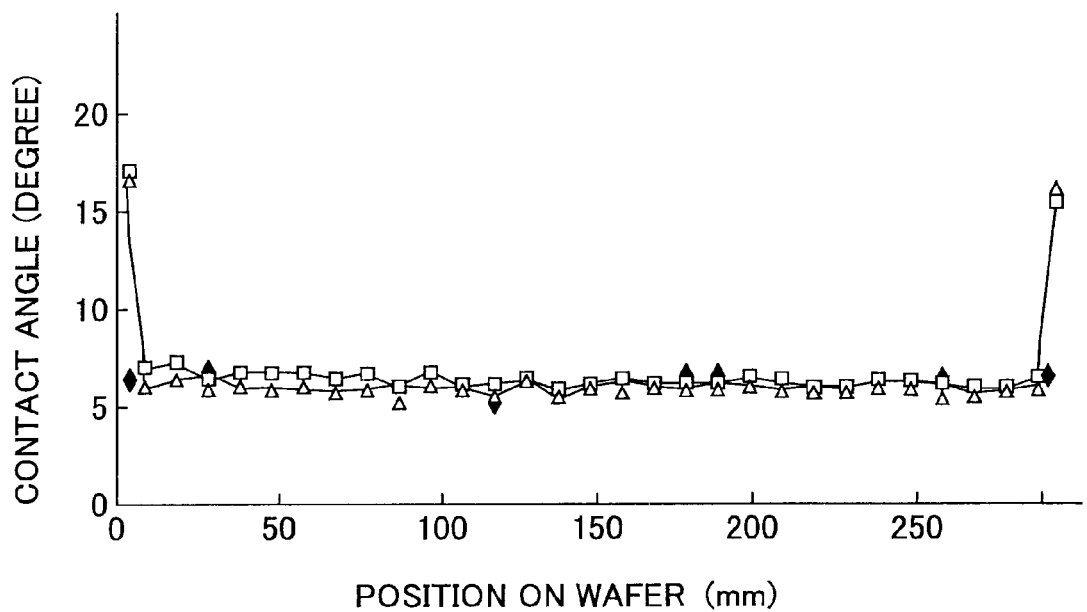
FIG. 14A is a characteristic diagram showing the measurement data of the contact angles on the rear surface of a wafer W, which are obtained to confirm the effect of the present invention.
Figure 14B:
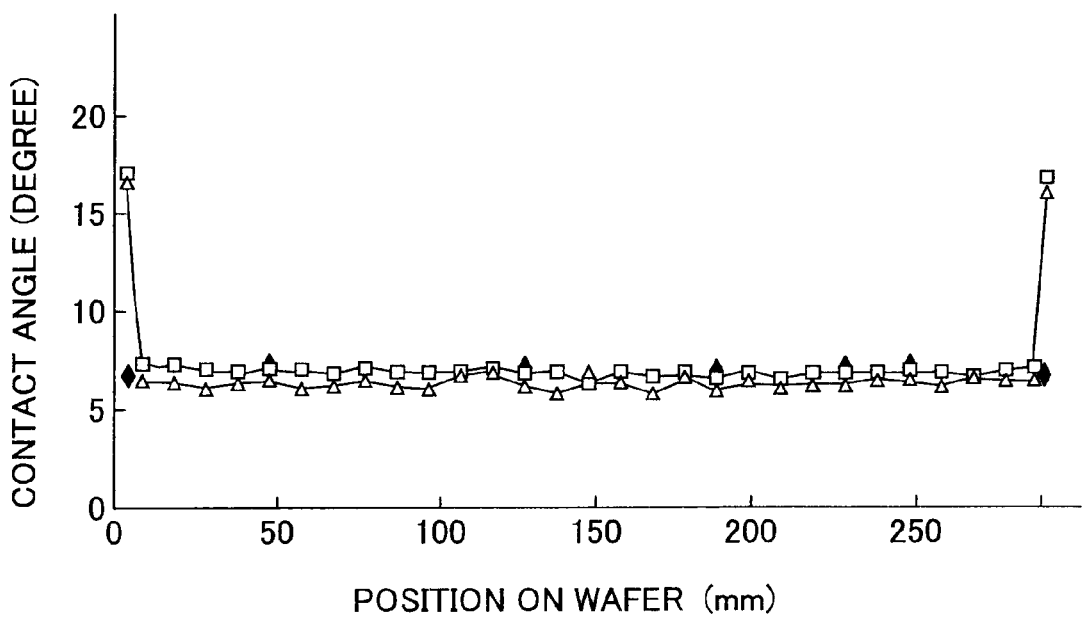
FIG. 14B is a characteristic diagram showing the measurement data of the contact angles on the rear surface of a wafer W, which are obtained to confirm the effect of the present invention.

The measurement data of the contact angles when pure water is used as the measurement solvent are shown in FIGS. 13A and 13B, and those of the contact angles when cyclohexanone is used as the measurement solvent are shown in FIGS. 14A and 14B. Here, FIGS. 13A and 14A show the data measured along the second line, and FIGS. 13B and 14B show the data measured along the first line. Furthermore, in FIGS. 13A, 13B, 14A, and 14B, a symbol "□" denotes the measurement data of the wafer W1, a symbol "Δ" denotes the measurement data of the wafer W2, and a symbol "♦" denotes the measurement data of the wafer W0 that has not been subjected to the hydrophobic processing.

As a result, in any case, the measurement data show that the contact angles of the wafer W1 and the wafer W2 are greater than the contact angle of the wafer W3 that has not been subjected to the hydrophobic processing at the area located inside about 10 mm away from the outer edge of the wafer, while the measurement data show that the contact angles of the wafer W1 and the wafer W2 are almost the same as the contact angle of the wafer W3 at the area located further inside the area about 10 mm away from the outer edge of the wafer. Therefore, it is found that the hydrophobic processing has been performed at the area located inside about 10 mm away from the outer edge of the wafer, while the hydrophobic processing has not been performed at the area located further inside the area about 10 mm away from the outer edge of the wafer.

Accordingly, it is understood that, with the hydrophobic processing using the hydrophobic processing apparatus according to the embodiment of the present invention, the hydrophobic processing on the rear surface of the wafer W due to HMDS gas largely spread thereto is prevented. Furthermore, on the rear surface of the wafer W, the area located inside about 10 mm away from its outer edge is subjected to the hydrophobic processing, but no problems arise in the subsequent process for cleansing the rear surface to such an extent.

The present invention is not limited to the specifically disclosed embodiment, and variations and modifications may be made without departing from the scope of the present invention.

What is claimed is:

1. A substrate processing apparatus comprising:
a container main body that has a mounting board for a substrate and an upper part that is open;
a cover body that covers the container main body, wherein a peripheral part of the cover body is spaced apart from a peripheral part of the container main body to thereby form a gap between the peripheral part of the cover body and the peripheral part of the container main body, thereby forming a non-hermetically sealed processing chamber for the substrate, the cover body having a protruding portion protruding downward, the protruding portion being provided between the mounting board and the peripheral part of the container main body, the mounting board being provided in a processing part of the chamber;
a processing gas supply part that supplies processing gas from a central upper part of the processing chamber to the substrate placed on the mounting board;
a purge gas supply passage that is a first opening part within the peripheral part of the container main body along the circumferential direction of the processing chamber;
an outflow passage formed along the circumferential direction of the processing chamber so as to eject to the outside of the processing chamber the purge gas supplied from the purge gas supply passage;
an exhaust passage that is a second opening part outside the substrate on the mounting board and inside the first opening part of the purge gas supply passage, and exhausts the process gas supplied from the processing gas supply part and the purge gas supplied from the first opening part of the purge gas supply passage, the second opening part being provided in a bottom surface of the protruding portion of the cover body; and
a gas flowing gap formed from the first opening part of the purge gas supply passage to the processing part of the processing chamber along the circumferential direction of the processing chamber between the container main body and the cover body, the gas flowing gap being formed under the protruding portion of the cover body so that the first opening part of the purge gas supply passage is in communication with the processing part of the processing chamber.

2. The substrate processing apparatus according to claim 1, wherein the exhaust passage exhausts the processing chamber from an area above the substrate on the mounting board.

3. The substrate processing apparatus according to claim 1, further comprising:
a gas supply source that is connected to the processing gas supplying part and supplies hydrophobic processing gas; and
an exhaust part that is connected to the processing gas exhaust passage.

4. The substrate processing apparatus according to claim 1, wherein the outflow passage is provided in the cover body and is open toward the gas flowing gap.

5. The substrate processing apparatus according to claim 1, further comprising:
a buffer chamber that is provided between the peripheral part of the container main body and the peripheral part of the cover body so as to face the first opening part of the purge gas supply passage along the circumferential direction of the processing chamber, and temporarily accumulates the purge gas.

6. The substrate processing apparatus according to claim 5, wherein the outflow passage is provided in the cover body and is open to the gas flowing gap as well as to the buffer chamber.

7. The substrate processing apparatus according to claim 5, wherein the outflow passage is provided in the cover body and extends upward so as to go through the cover body from the buffer chamber.

8. The substrate processing apparatus according to claim 1, wherein an upper wall part of the cover body includes a flat cavity part therein, and a downstream part of the exhaust passage is connected to the flat cavity part.

9. The substrate processing apparatus according to claim 1, further comprising:
a supplied flow-rate regulating mechanism that regulates a flow rate of the processing gas supplied from the processing gas supplying part;
an exhaust flow-rate regulating mechanism that regulates a flow rate of a gas exhausted from the processing gas exhaust passage; and
a control unit that controls the supplied flow-rate regulating mechanism and the exhaust flow-rate regulating mechanism so that a supplied flow-rate of the processing gas from the processing gas supply part is less than an exhaust flow-rate in the processing gas exhaust passage, and the purge gas supplied from the purge gas supply passage is drawn into the processing chamber due to a negative pressure inside the processing chamber caused by a difference between the flow rates.

* * * * *